US012238892B2

(12) United States Patent
Sover et al.

(10) Patent No.: US 12,238,892 B2
(45) Date of Patent: Feb. 25, 2025

(54) IMMERSION COOLING FOR INTEGRATED CIRCUIT DEVICES

(71) Applicant: Intel Corporation, Santa Clara, CA (US)

(72) Inventors: Raanan Sover, Haifa (IL); James Williams, Portland, OR (US); Bradley Smith, Vancouver, WA (US); Nir Peled, Chandler, AZ (US); Paul George, Chandler, AZ (US); Jason Armstrong, Phoenix, AZ (US); Alexey Chinkov, Haifa (IL); Meir Cohen, Chandler, AZ (US); Je-Young Chang, Tempe, AZ (US); Kuang Liu, Queen Creek, AZ (US); Ravindranath Mahajan, Chandler, AZ (US); Kelly Lofgreen, Phoenix, AZ (US); Kyle Arrington, Gilbert, AZ (US); Michael Crocker, Portland, OR (US); Sergio Antonio Chan Arguedas, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 839 days.

(21) Appl. No.: 17/128,620

(22) Filed: Dec. 21, 2020

(65) Prior Publication Data

US 2022/0201889 A1 Jun. 23, 2022

(51) Int. Cl.
*H05K 7/20* (2006.01)
(52) U.S. Cl.
CPC ......... *H05K 7/203* (2013.01); *H05K 7/20309* (2013.01); *H05K 7/20318* (2013.01)

(58) Field of Classification Search
CPC ............... H05K 7/203; H05K 7/20318; H05K 7/20309; H05K 7/20236; H05K 7/20381;
(Continued)

(56) References Cited

U.S. PATENT DOCUMENTS 4,757,370 A * 7/1988 Agonafer ............. H01L 23/427
257/715
5,884,693 A * 3/1999 Austin ................. H05K 7/2069
165/45

(Continued)

FOREIGN PATENT DOCUMENTS

EP 3232753 10/2017
JP 04072796 A * 3/1992

OTHER PUBLICATIONS

JP-04072796-A English Translation (Year: 1992).*

(Continued)

*Primary Examiner* — Amir A Jalali
(74) *Attorney, Agent, or Firm* — Essential Patents Group, LLP

(57) ABSTRACT

A two-phase immersion cooling system for an integrated circuit assembly may be formed utilizing boiling enhancement structures formed on or directly attached to heat dissipation devices within the integrated circuit assembly, formed on or directly attached to integrated circuit devices within the integrated circuit assembly, and/or conformally formed over support devices and at least a portion of an electronic board within the integrated circuit assembly. In still a further embodiment, the two-phase immersion cooling system may include a low boiling point liquid including at least two liquids that are substantially immiscible with one another.

15 Claims, 8 Drawing Sheets

(58) Field of Classification Search
CPC .......... H05K 7/20254; H05K 7/20872–20881;
H05K 7/20927–20936; H01L 23/34;
H01L 23/373; H01L 23/427; H01L 23/44;
H01L 23/46; H01L 23/473; G06F 1/20
See application file for complete search history.

(56) References Cited

U.S. PATENT DOCUMENTS

| | | | | |
|---|---|---|---|---|
| 8,953,318 | B1* | 2/2015 | Smith | H01L 23/427 165/185 |
| 11,658,044 | B2* | 5/2023 | Tseng | H01L 25/50 438/122 |
| 2008/0093058 | A1* | 4/2008 | Kim | F28F 13/187 165/104.33 |
| 2013/0234313 | A1* | 9/2013 | Wainerdi | H01L 24/92 438/464 |
| 2015/0062806 | A1* | 3/2015 | Shelnutt | H05K 7/20318 361/679.53 |
| 2015/0130045 | A1* | 5/2015 | Tseng | H01L 25/0652 438/122 |
| 2017/0303434 | A1* | 10/2017 | Katsumata | H05K 7/20327 |
| 2020/0100396 | A1 | 3/2020 | Iyengar et al. | |
| 2020/0281093 | A1* | 9/2020 | Korikawa | F25B 49/00 |
| 2021/0195798 | A1* | 6/2021 | Neal | H01L 23/3675 |
| 2021/0221776 | A1* | 7/2021 | Smith | F01K 25/02 |
| 2022/0187023 | A1* | 6/2022 | Kang | F28D 15/02 |

OTHER PUBLICATIONS

Extended European Search Report for European Patent Application No. 21198796.1, dated Aug. 10, 2022.
Office Action and Partial Search Report for European Patent Application No. 21198796.1, dated May 10, 2022.
U.S. Appl. No. 17/668,236, filed Feb. 9, 2022.
Chang, J.Y., et al., "Boiling Heat Transfer Phenomena from Micro-Porous and Porous Surfaces in Saturated FC-72", International Journal of Heat and Mass Transfer, vol. 40, No. 18, pp. 4437-4447, 1997.
Chang, J.Y., et al., "Enhanced Boiling Heat Transfer from Micro-Porous Cylindrical Surfaces in Saturated FC-87 and R-123", ASME Journal of Heat Transfer, vol. 119, No. 2, pp. 319-325, 1997.
Chang, J.Y., et al., "Enhanced Boiling Heat Transfer from Micro-Porous Surfaces; Effects of Coating Composition and Method", International Journal of Heat and Mass Transfer, vol. 40, No. 18, pp. 4449-4460, 1997.
Chang, J.Y., et al., "Heater Orientation Effects on Pool Boiling of Micro-Porous-Enhanced Surfaces in Saturated FC-72", ASME Journal of Heat Transfer, vol. 118, No. 4, pp. 937-943, 1996.

* cited by examiner

IMMERSION COOLING FOR INTEGRATED CIRCUIT DEVICES

TECHNICAL FIELD

Embodiments of the present description generally relate to the field of thermal management for integrated circuit devices, and, more specifically, to immersion cooling for integrated circuit devices.

BACKGROUND

The integrated circuit industry is continually striving to produce ever faster, smaller, and thinner integrated circuit devices and packages for use in various electronic products, including, but not limited to, computer servers and portable products, such as portable computers, electronic tablets, cellular phones, digital cameras, and the like.

As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed. Thus, heat dissipation devices are used to remove heat from the integrated circuit devices in an integrated circuit package. In one example, heat spreading and dissipation devices may be thermally attached to integrated circuit devices for heat removal. The heat spreading and dissipation devices, in turn, dissipate the heat into the surrounding atmosphere. In another example, a liquid cooling device, such as a heat exchanger or a heat pipe, may be thermally attached to integrated circuit devices for heat removal. However, as power densities and power envelopes increase to reach peak performance, these methods are becoming ineffective in removing sufficient amounts of heat.

One emerging heat removal technique is two-phase immersion cooling. This technique essentially comprises immersing an integrated circuit assembly into a liquid cooling bath containing a low boiling point liquid which vaporizes and, thus, cooling the integrated circuit assembly through latent heat transfer, as it generates heat. Although it is a promising technology, two-phase immersion cooling has various challenges to effective operation, as will be understood to those skilled in the art.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
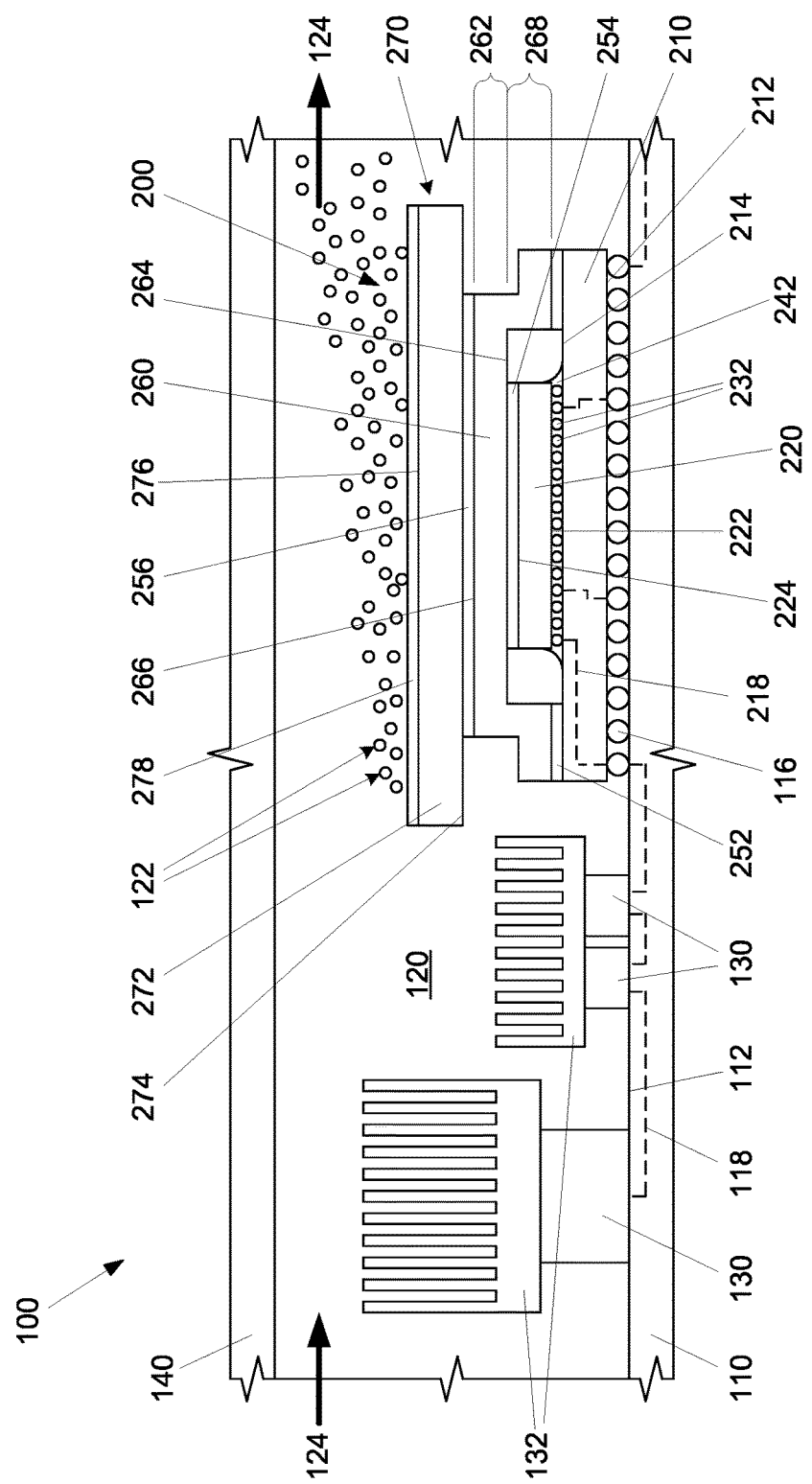
FIG. 1 is a side cross-sectional view of an integrated circuit assembly, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to the use of two-phase immersion cooling for integrated circuit assemblies. In one embodiment of the present description, an integrated circuit assembly may comprise an integrated circuit package having a heat dissipation device thermally coupled to integrated circuit device, wherein the heat dissipation device includes a boiling enhancement structure formed on or directly attached thereto. In another embodiment of the present description, the heat dissipation device may be removed and the boiling enhancement structure may be formed on or directly attached on the integrated circuit device. In a further embodiment of the present description, the integrated circuit assembly may include at least one support device that is electrically attached to an electronic board to which the integrated circuit device is electrically attached, wherein a boiling enhancement material layer is conformally formed to over the support device and at least a portion of the electronic board. In still a further embodiment of the present description, the two-phase immersion cooling system may include a low boiling point liquid including at least two liquids that are substantially immiscible with one another.

FIG. 1 illustrates an integrated circuit assembly 100 having at least one integrated circuit package 200 electrically attached to an electronic substrate 110. The electronic substrate 110 may be any appropriate structure, including, but not limited to, a motherboard, printed circuit board, and the like. The electronic substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The electronic substrate 110 may further include conductive routes 118 or "metallization" (shown in dashed lines) extending through the electronic substrate 110. As will be understood to those skilled in the art, the conductive routes 118 may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, and aluminum, alloys thereof, and the like. As will be understood to those skilled in the art, the electronic substrate 110 may be a cored substrate or a coreless substrate.

The at least one integrated circuit package 200 may be electrically attached to the electronic substrate 110 in a configuration generally known as a flip-chip or controlled collapse chip connection ("C4") configuration, according to an embodiment of the present description. The integrated circuit package 200 may comprise a package substrate or interposer 210 with a first surface 212 and an opposing second surface 214, and an integrated circuit device 220 electrically attached proximate the second surface 214 of the package interposer 210. In an embodiment of the present description, the package interposer 210 may be attached to the electronic substrate or board 110 with the plurality of package-to-substrate interconnects 116. In one embodiment of the present description, the package-to-substrate interconnects 116 may extend between bond pads (not shown) proximate a first surface 112 of the electronic substrate 110 and bond pads (not shown) proximate the first surface 212 of the package interposer 210.

The package interposer 210 may comprise any of the materials and/or structure as discussed previously with regard to the electronic substrate 110. The package interposer 210 may further include conductive routes 218 or "metallization" (shown in dashed lines) extending through the package interposer 210, which may comprise any of the materials and/or structures as discussed previously with regard to the conductive routes 118 of the electronic substrate 110. The bond pads (not shown) proximate the first surface 212 of the package interposer 210 may be in electrical contact with the conductive routes 218, and the conductive routes 218 may extend through the package interposer 210 and be electrically connected to bond pads (not shown) proximate the second surface 214 of the package substrate 210. As will be understood to those skilled in the art, the package interposer 210 may be a cored substrate or a coreless substrate.

The integrated circuit device 220 may be any appropriate device, including, but not limited to, a microprocessor, a chipset, a graphics device, a wireless device, a memory device, an application specific integrated circuit, a transceiver device, an input/output device, combinations thereof, stacks thereof, or the like. As shown in FIG. 1, the integrated circuit device 220 may each have a first surface 222 and an opposing second surface 224.

In an embodiment of the present description, the integrated circuit device 220 may be electrically attached to the package interposer 210 with a plurality of device-to-substrate interconnects 232. In one embodiment of the present description, the device-to-substrate interconnects 232 may extend between bond pads (not shown) on the first surface 212 of the package interposer 210 and bond pads (not shown) on the first surface 222 of the integrated circuit device 220. The device-to-substrate interconnects 232 may be any appropriate electrically conductive material or structure, including, but not limited to, solder balls, metal bumps or pillars, metal filled epoxies, or a combination thereof. In one embodiment of the present description, the device-to-substrate interconnects 232 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment of the present description, the device-to-substrate interconnects 232 may be copper bumps or pillars. In a further embodiment of the present description, the device-to-substrate interconnects 232 may be metal bumps or pillars coated with a solder material.

The device-to-substrate interconnects 232 may be in electrical communication with integrated circuitry (not shown) within the integrated circuit device 220 and may be in electrical contact with the conductive routes 218. The conductive routes 218 may extend through the package interposer 210 and be electrically connected to package-to-board interconnects 116. As will be understood to those skilled in the art, the package interposer 210 may reroute a fine pitch (center-to-center distance) of the device-to-interposer interconnects 232 to a relatively wider pitch of the package-to-substrate interconnects 116. The package-to-substrate interconnects 116 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). Although in FIG. 1 shows the integrated circuit package 200 attached to the electronic substrate 110 with an interconnect-type attachment, the embodiments of the present description are not so limited. For example, the integrated circuit package 200 may be attached to a socket (not shown) that is electrically attached to the first surface 112 of the electronic substrate 110.

As further shown in FIG. 1, integrated circuit package 200 may further include a heat dissipation device 260, such as an integrated heat spreader, that may be thermally coupled with the second surface 224 of the integrated circuit device 220 with a first thermal interface material 254. The heat dissipation device 260 may comprise a main body 262, having a first surface 264 and an opposing second surface 266, and at least one boundary wall 268 extending from the first surface 264 of the main body 262 of the heat dissipation device 260. The at least one boundary wall 268 may be attached or sealed to the first surface 212 of the package interposer 210 with the attachment adhesive or sealant layer 252.

The heat dissipation device 260 may be made of any appropriate thermally conductive material, including, but not limited to, at least one metal material and alloys of more than one metal, or highly doped glass or highly conductive ceramic material, such as aluminum nitride. In an embodiment of the present description, the heat dissipation device 260 may comprise copper, nickel, aluminum, alloys thereof, laminated metals including coated materials (such as nickel coated copper), and the like. The first thermal interface material 254 may be any appropriate, thermally conductive material, including, but not limited to, a thermal grease, a thermal gap pad, a polymer, an epoxy filled with high thermal conductivity fillers, such as metal particles or silicon particles, and the like.

As illustrated in FIG. 1, the heat dissipation device 260 may be a single material throughout, such as when the heat dissipation device 260 including the heat dissipation device boundary wall 268 is formed by a single process step, including but not limited to, stamping, skiving, molding, and the like. However, embodiments of the present description may also include heat dissipation device 260 made of more than one component. For example, the heat dissipation device boundary wall 268 may be formed separately from the main body 262, then attached together to form the heat dissipation device 260. In one embodiment of the present description, the boundary wall 268 may be a single "picture frame" structure surrounding the integrated circuit device 220.

The attachment adhesive 252 may be any appropriate material, including, but not limited to, silicones (such as polydimethylsiloxane), epoxies, and the like. It is understood that the boundary wall 268 not only secures the heat dissipation device 260 to the package interposer 210, but also helps to maintain a desired distance (e.g. bond line thickness) between the first surface 264 of the heat dissipation device 260 and second surface 224 of the integrated circuit device 220.

Prior to the attachment of the heat dissipation device 260, an electrically-insulating underfill material 242 may be disposed between the integrated circuit device 220 and the package interposer 210, which substantially encapsulates the device-to-interposer interconnects 232. The underfill material 242 may be used to reduce mechanical stress issues that can arise from thermal expansion mismatch between the package interposer 210 and the integrated circuit device 220. The underfill material 242 may be an epoxy material, including, but not limited to epoxy, cyanoester, silicone, siloxane and phenolic based resins, that has sufficiently low viscosity to be wicked between the integrated circuit device 220 and the package interposer 210 by capillary action when introduced by an underfill material dispenser (not shown), which will be understood to those skilled in the art. The underfill material 242 may be subsequently cured (hardened), such as by heat or radiation.

The heat dissipation device 260 may have a boiling enhancement coating 270 thermally coupled thereto for enhanced heat removal. The boiling enhancement coating 270 may comprise a boiler plate 272, having a first surface 274 and an opposing second surface 276, with a second thermal interface material 256 between the first surface 274 of boiler plate 272 and the second surface 266 of the main body 262 of the heat dissipation device 260, and with a high surface area layer 278 on the second surface 276 of the boiler plate 272. In one embodiment of the present description, the boiler plate 272 may comprise a metal, such as copper, aluminum, alloys thereof, and the like, and the high surface area layer 278 may comprise a metallic foam, a sintered metal pad, a metal mesh, and the like. In a specific embodiment of the present description, the boiler plate 272 may be copper and the high surface area layer 278 may be sintered copper. The second thermal interface material 256 may be any appropriate, thermally conductive material, including, but not limited to, a thermal grease, a thermal gap pad, a polymer, an epoxy filled with high thermal conductivity fillers, such as metal particles or silicon particles, and the like.

As shown in FIG. 1, the integrated circuit assembly 100 may further include a dielectric low-boiling point liquid 120 in contact with the integrated circuit package 200. As illustrated, the dielectric low-boiling point liquid 120 may vaporize (shown in vapor or gas state as bubbles 122) on the boiling enhancement coating 270. For the purpose of the present application, the dielectric low-boiling point liquid 120 may be defined to be a liquid having a boiling point lower than about 60 degrees Celsius. In one embodiment of the present description, the dielectric low-boiling point liquid 120 may comprise a fluorocarbon-based fluid.

In an embodiment of the present description, the dielectric low-boiling point liquid 120 may comprise perfluorohexane. In another embodiment of the present description, the dielectric low-boiling point liquid 120 may comprise a perfluoroalkylmorpholine, such as 2,2,3,3,5,5,6,6-octafluoro-4-(trifluoromethyl)morpholine. The high surface area layer 278 of the boiling enhancement coating 270 may provide a high contact area for the dielectric low-boiling point liquid 120 in a liquid state to nucleate and form the vapor or gas state 122.

As further shown in FIG. 1, the dielectric low-boiling point liquid 120 may flow (shown by arrows 124) between the electronic substrate 110 and an adjacent electronic substrate or fluid containment structure 140, as driven by a pump or bubble nucleation in vertical orientation. As still further shown in FIG. 1, the integrated circuit assembly 100 may further include at least one support device 130 electrically attached to the electronic substrate 110, such as by surface mounting techniques known in the art. The support device 130 may be any appropriate integrated circuit device. In one embodiment of the present description, the support device 130 may be an integrated circuit device that supports the operation of the integrated circuit package 200, including, but not limited to, a voltage regulator, a capacitor, and the like. Thus, the at least one support device 130 may be in electrically attached to the integrated circuit package 200 and, more particularly, electrically attached to the integrated circuit device 220 of the integrated circuit package 200. As further shown in FIG. 1, the support device(s) 130 may have at least one heat dissipation device 132 to conductively dissipate heat into the dielectric low-boiling point liquid 120. The heat dissipation device 132 may be made of any appropriate thermally conductive material, including, but not limited to at least one metal (such as copper, nickel, aluminum, alloys thereof, laminated metals including coated materials (such as nickel coated copper, and the like), highly doped glass, and highly conductive ceramic material, such as aluminum nitride. The heat dissipation device 132 may include high surface area dissipation structures, such as a structure having fins or pillars/columns formed in a thermally conductive structure.

Figure 2:
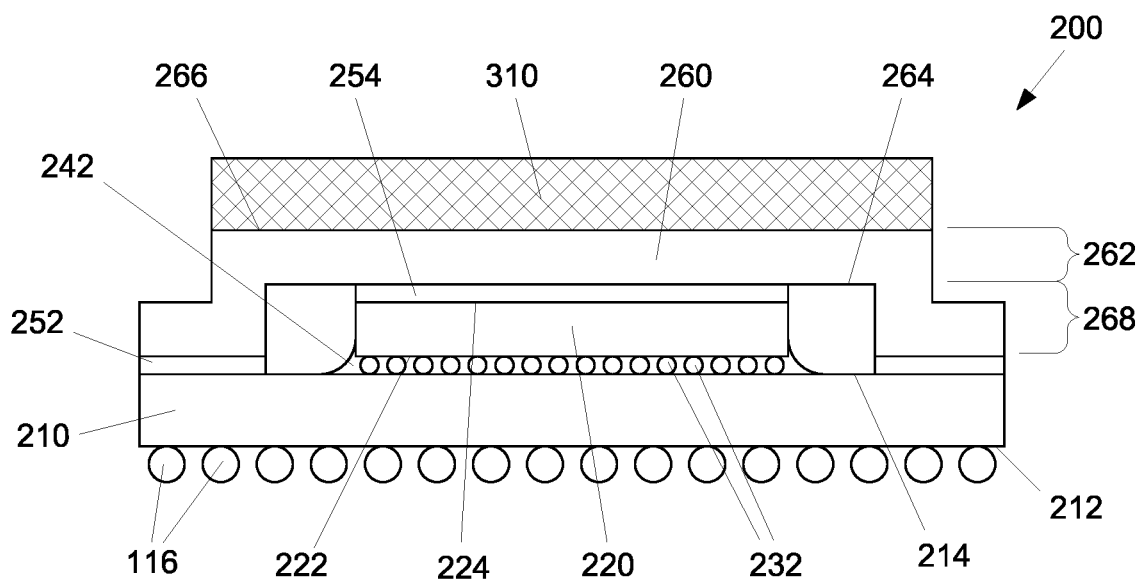
FIG. 2 is a side cross-sectional view of an integrated circuit package having a boiling enhancement structure directly formed on a heat dissipation device, according to an embodiment of the present description.
Figure 3:
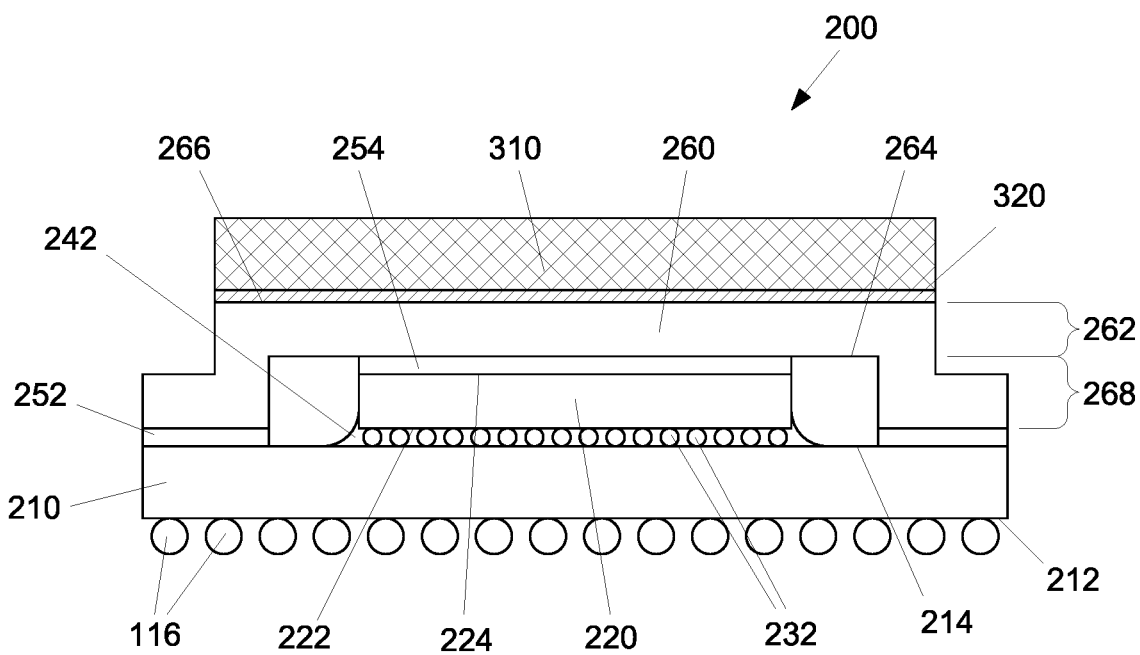
FIG. 3 is a side cross-sectional view of an integrated circuit package having a boiling enhancement structure adhered to a heat dissipation device, according to one embodiment of the present description.
Figure 4:
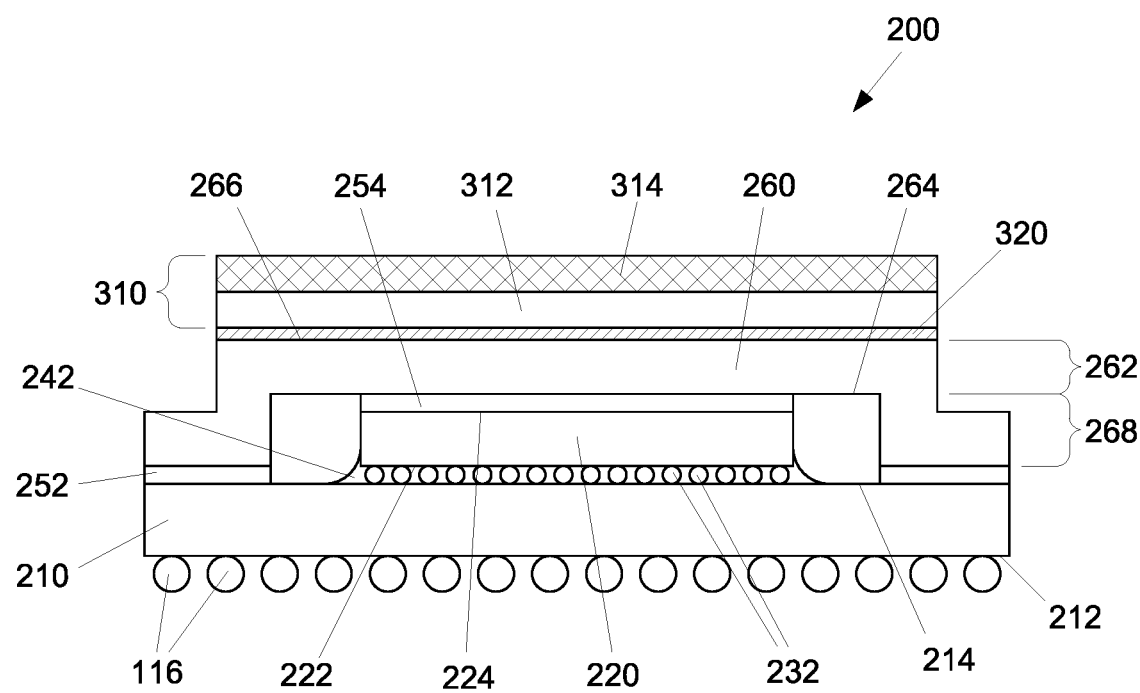
FIG. 4 is a side cross-sectional view of an integrated circuit package having a boiling enhancement structure adhered to a heat dissipation device, according to another embodiment of the present description.

In one embodiment of the present description, areas of thermal resistance may be eliminated in order to improve the performance of the two-phase immersion cooling system. It is understood that getting the dielectric low-boiling point liquid 120 as close to the heat source (e.g. the integrated circuit device 220) is key for heat dissipation efficiency. As shown in FIGS. 2-4, the boiling enhancement coating 270 (i.e. the boiling plate 272, the high surface area layer 278, and the second thermal interface material 256) of FIG. 1 is replaced with a boiling enhancement structure 310 formed on or adhered to the second surface 266 of the main body 262 of the heat dissipation device 260. The boiling enhancement structure 310 may comprise a thermally conductive, high surface area structure. In one embodiment of the present description, the boiling enhancement structure 310 may be directly attached to the second surface 266 of the main body 262 of the heat dissipation device 260. For the purposes of the present description, the term "directly attached" may be defined to mean forming the boiling enhancement structure 310 on the second surface 266 of the main body 262 of the heat dissipation device 260, such as by growth, deposition, printing, or the like, or attaching with a thermally conductive adhesive 320, such that the thermally conductive adhesive 320 contacts the boiling enhancement structure 310 and contact the second surface 266 of the main body 262 of the heat dissipation device 260. In an embodiment of the present description, as show in FIG. 2, the boiling enhancement structure 310 may be formed on the second surface 266 of the main body 262 of the heat dissipation device 260, such as by growth, deposition, printing, or the like. In one embodiment of the present description, metal powder or particles may be sintered to the second surface 266 of the main body 262 of the heat dissipation device 260. As will be understood to those skilled in the art, sintering is a process of compacting and forming a solid mass from a powdered or particulate material by heat and/or pressure without melting the material to the point for forming a liquid. Sintering materials and processes are well known in the art and for the purposes of clarity and conciseness with not be described therein.

In one embodiment of the present description, as shown in FIG. 3, the boiling enhancement structure 310 may comprise a carbon foam or metal foam (such as copper foam, nickel foam, and the like) attached to the second surface 266 of the main body 262 of the heat dissipation device 260 with a thermally conductive adhesive 320. In one embodiment of the present description, the foam may be bi-continuous which will allow the dielectric low-boiling point liquid 120 to flow through the boiling enhancement structure 310 as it is vaporized. Foam structures are well known in the art and for the purposes of clarity and conciseness will not be described therein. In another embodiment of the present description, the boiling enhancement structure 310 may comprise a metal mesh (such as a copper mesh and the like) attached to the second surface 266 of the main body 262 of the heat dissipation device 260 with the thermally conductive adhesive 320. Mesh structures are well known in the art and for the purposes of clarity and conciseness will not be described therein.

In another embodiment of the present description, as shown in FIG. 4, the boiling enhancement structure 310 may comprise a thermally conductive film 312 having a sintered metal powder layer 314 thereon, wherein the thermally conductive film 312 is attached to the second surface 266 of the main body 262 of the heat dissipation device 260 with the thermally conductive adhesive 320. In one embodiment of the present description, the thermally conductive film 312 and the sintered metal powder layer 314 may comprise copper.

In a further embodiment of the present description, the thermally conductive adhesive 320 may be a solder material, such as an indium/tin alloy solder. In another embodiment of the present description, the thermally conductive adhesive 320 may be high thermally conductivity polymer, such as a silver filled epoxy (i.e. an epoxy material with silver particular dispersed therein). One process for attaching the boiling enhancement structure 310 may comprise forming the thermally conductive adhesive 320 on the second surface 266 of the main body 262 of the heat dissipation device 260, such as by screen-printing, dispensing, and the like. The boiling enhancement structure 310 may then be aligned on the thermally conductive adhesive 320 and subjected to a thermal compression bonding process, as will be understood to those skilled in the art.

The embodiments of FIG. 2-4 may reduce the height of the integrated circuit package 200 and also removes the second thermal interface material 256, which may be a source of thermal resistance. Thus, the embodiment of FIGS. 2-4 may result in a higher thermal performance than the boiling enhancement coating 270 of FIG. 1.

Figure 5:
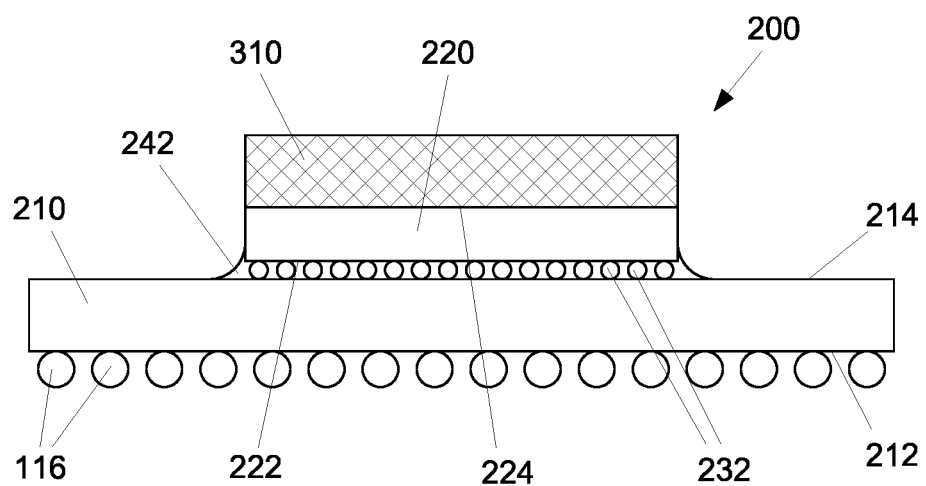
FIG. 5 is a side cross-sectional view of an integrated circuit package having a boiling enhancement structure directly formed on an integrated circuit device of an integrated circuit package, according to an embodiment of the present description.
Figure 6:
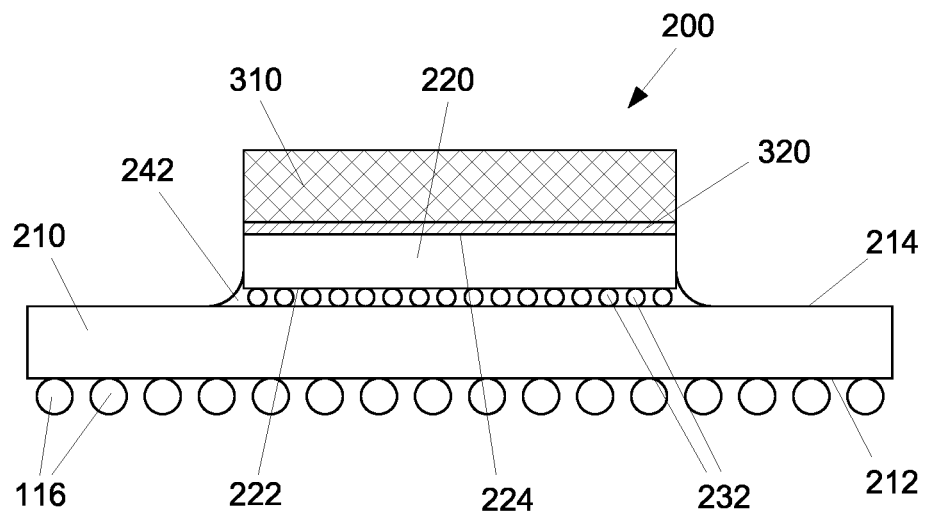
FIG. 6 is a side cross-sectional view of an integrated circuit package having a boiling enhancement structure adhered to an integrated circuit device of an integrated circuit package, according to one embodiment of the present description.
Figure 7:
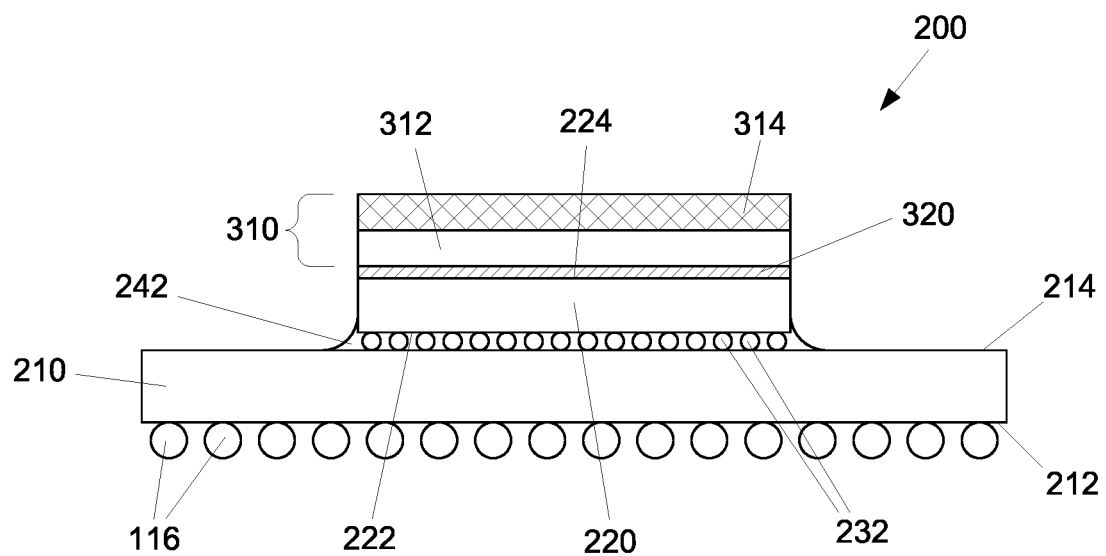
FIG. 7 is a side cross-sectional view of an integrated circuit package having a boiling enhancement structure adhered to an integrated circuit device of an integrated circuit package, according to another embodiment of the present description.

In other embodiments of the present description, further areas of thermal resistance may be eliminated in order to improve the performance of the two-phase immersion cooling system. As shown in FIGS. 5-7, the boiling enhancement coating 270 (i.e. the boiling plate 272, the high surface area layer 278 and the second thermal interface material 256), the heat dissipation device 260, and the first thermal interface material 254 of FIG. 1 may be removed or replaced with the boiling enhancement structure 310 formed on or adhered to the second surface 224 of the integrated circuit device 220. For the purposes of the present description, the term "directly attached" may be further defined to mean forming the boiling enhancement structure 310 on the second surface 224 of the integrated circuit device 220, such as by growth, deposition, printing, or the like, or attaching with a thermally conductive adhesive 320, such that the thermally conductive adhesive 320 contacts the boiling enhancement structure 310 and contact the second surface 224 of the integrated circuit device 220. In an embodiment of the present description, as show in FIG. 5, the boiling enhancement structure 310 may be formed on the second surface 224 of the integrated circuit device 220, such as by growth, deposition, printing, or the like. In one embodiment of the present description, metal powder or particles may be sintered to the second surface 224 of the integrated circuit device 220, similar to the embodiment discussed with regard to FIG. 2.

In one embodiment of the present description, as shown in FIG. 6, the boiling enhancement structure 310 may be adhered to the second surface 224 of the integrated circuit device 220 with the thermally conductive adhesive 320. In an embodiment of the present description, the boiling enhancement structure 310 may comprise a carbon foam or metal foam (such as copper foam, nickel foam, and the like), similar to the embodiment discussed with regard to FIG. 3. In another embodiment of the present description, the boiling enhancement structure 310 may comprise a metal mesh (such as a copper mesh and the like), also similar to the embodiment discussed with regard to FIG. 3. In another embodiment of the present description, as shown in FIG. 7, the boiling enhancement structure 310 may comprise a thermally conductive film 312 having a sintered metal powder layer 314 thereon, similar to the embodiment discussed with regard to FIG. 4.

As with the embodiments of FIGS. 2-4, the embodiments of FIGS. 5-7, may reduce the height of the integrated circuit package 200 and may result in a higher thermal performance than the boiling enhancement coating 270 of FIG. 1.

Referring back to FIG. 1, as previously discussed, the integrated circuit assembly 100 may include at least one support device 130 electrically attached to the electronic substrate 110, wherein the support device(s) 130 may have at least one heat dissipation device 132 to conductively dissipate heat into the dielectric low-boiling point liquid 120. However, the heat dissipation device(s) 132 may include high surface area dissipation structures that may impede the flow or circulation 124 of the dielectric low-boiling point liquid 120. Furthermore, due to z-height variation between multiple support devices 130, it may be difficult to achieve good thermal contact between the heat dissipation devices 132 and the support device 130, as will be understood to those skilled in the art.

Figure 8:
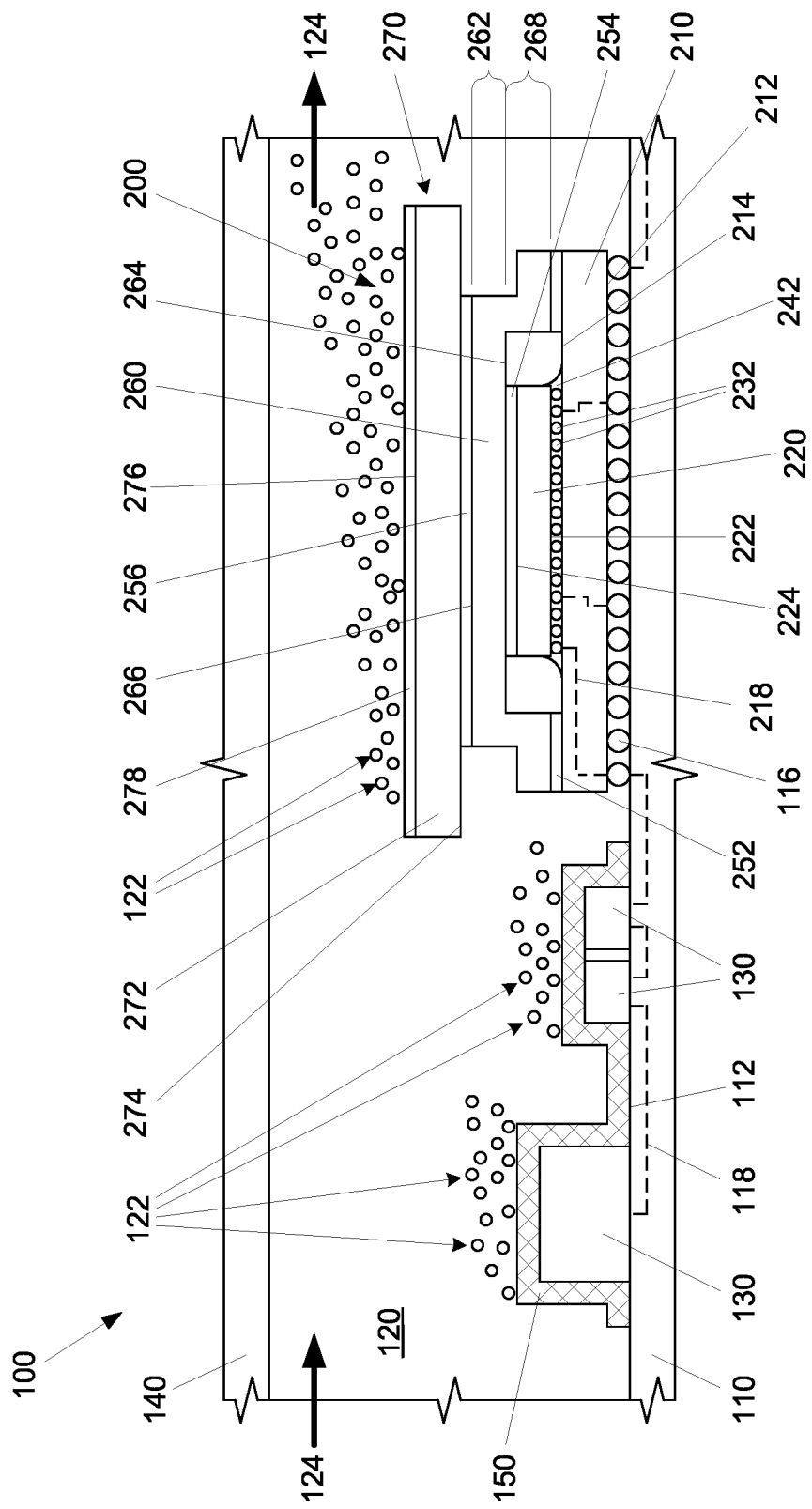
FIG. 8 is a side cross-sectional views of an immersion cooling assembly having a conformal boiling enhancement layer formed over support devices of an integrated circuit assembly, according to an embodiment of the present description.

In one embodiment of the present description, the heat dissipation device(s) 132 for the support devices 130 of FIG. 1 may be replaced with a substantially conformal boiling enhancement coating 150, as shown in FIG. 8. The conformal boiling enhancement coating 150 may enable nucleate boiling (i.e. at lower superheat) to take advantage of the two-phase cooling opportunity with the dielectric low-boiling point liquid 120 rather than mere conductive heat dissipation. As shown in FIG. 8, the substantially conformal boiling enhancement coating 150 may cover the support devices 130 and a portion of the first surface 112 of the electronic substrate 110.

In one embodiment of the present description, the conformal boiling enhancement coating 150 may be a microporous coating. In an embodiment of the present description, the conformal boiling enhancement coating 150 may comprise conductive particles dispersed in an epoxy material. In a specific embodiment of the present description, the conformal boiling enhancement coating 150 comprises a mixture of conductive particles, epoxy, and methylethylketone. In another specific embodiment of the present description, the conductive particles may comprise alumina particles. In still another specific embodiment of the present description, the conductive particles may comprise diamond particles. In one embodiment of the present description, the conductive particles may have an average diameter between about 1 and 20 microns. In a specific embodiment of the present description, the conductive particles may have an average diameter of about 10 microns. The conformal boiling enhancement coating 150 may be formed by any appropriate process known in the art, including, but not limited to, spray coating.

Figure 9:
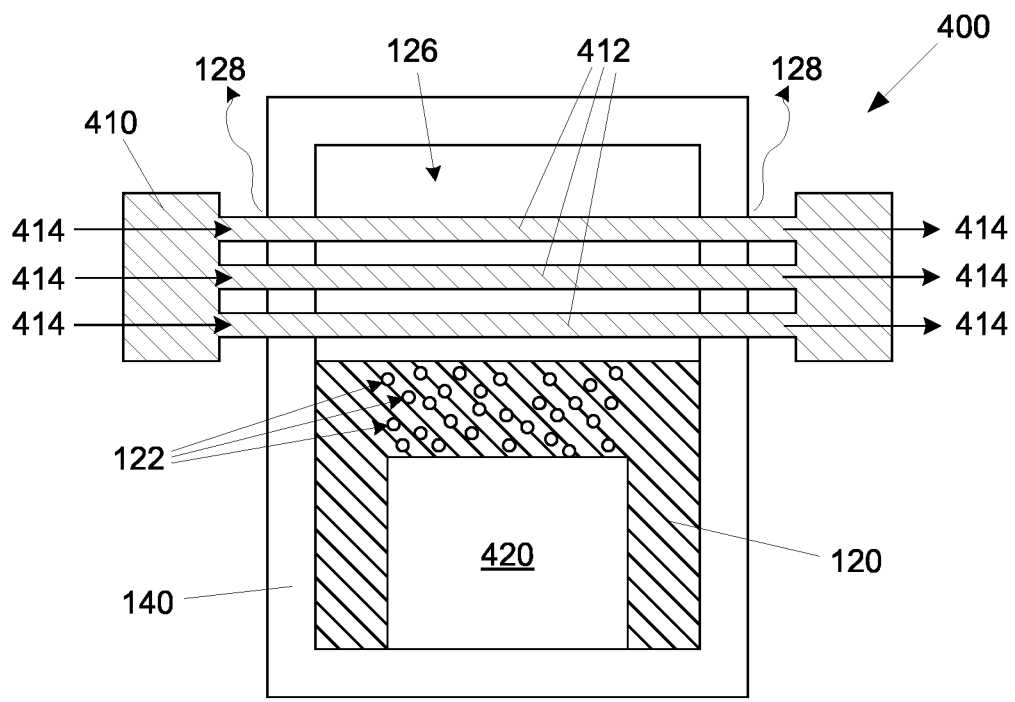
FIG. 9 is a side cross-sectional view of an immersion cooling assembly, according to one embodiment of the present description.

One issue with regard to two-phase immersion systems is the inability to maintain an "airtight" seal in order to prevent loss of expensive, vaporized dielectric low-boiling liquid. FIG. 9 illustrates a two-phase immersion system 400 comprising the fluid containment structure 140, the dielectric low-boiling point liquid 120 disposed within the fluid containment structure 140, and a condensation structure 410 at least partially within the fluid containment structure 140. In operation, a heat generation source 420, such as the integrated circuit package 200 of any of FIGS. 1-12 may be immersed in the dielectric low-boiling point liquid 120. The heat produced by the heat generation source 420 vaporizes the dielectric low-boiling point liquid 120 (shown in vapor or gas state as bubbles 122), which collects gravitationally above the dielectric low-boiling point liquid 120 as a vapor portion 126 within the fluid containment structure 140. As illustrated, the condensation structure 410 may extend through the vapor portion 126. In one embodiment of the present description, the condensation structure 410 may be a heat exchanger comprising a plurality of tubes 412 with a cooling fluid shown by arrows 414 (i.e., a fluid colder than the condensation point of the vapor portion 126 of the dielectric low-boiling liquid 120) may flow through tubes 412 to condense the vapor portion 126 back to the dielectric low-boiling point liquid 120.

The loss (shown as arrows 128) of the vapor portion 126 may be due to numerous pin holes or micro holes, which may form at points where components (such as the tubes 412 of the condensation structure 410, electrical lines (not shown), connectors (not shown), and the like) extend through the fluid containment structure 140. Furthermore, when the 140 needs to be serviced, it is opened, usually a lid (not shown) in the area of the vapor portion 126, which will result in the loss of the vapor portion 126 to the atmosphere.

Figure 10:
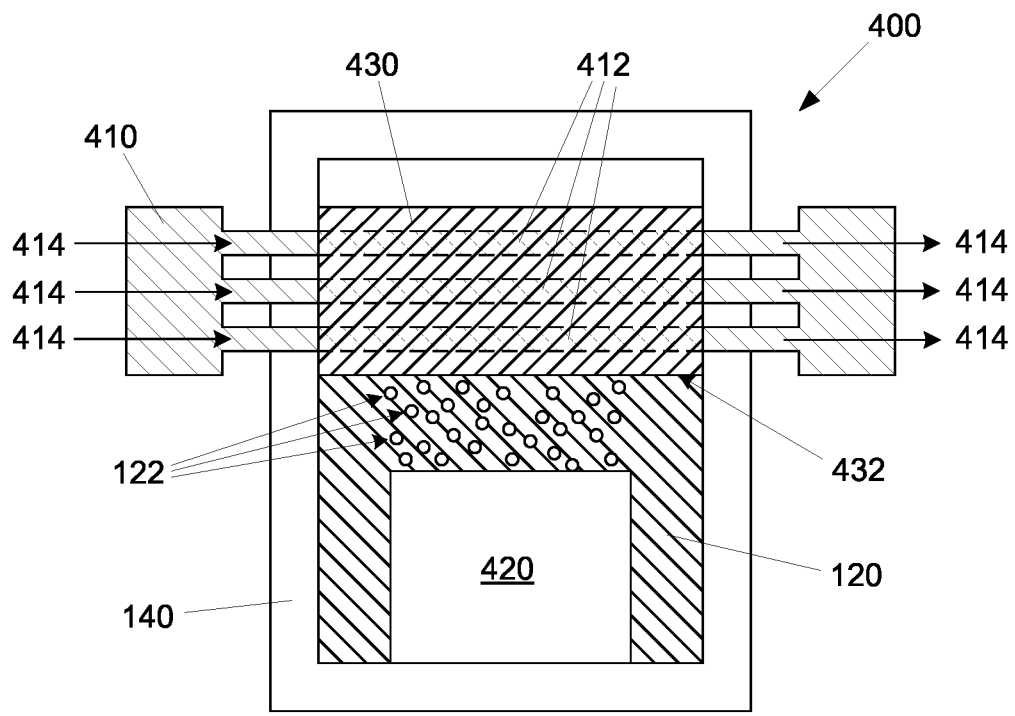
FIG. 10 is a side cross-sectional view of an immersion cooling assembly having two immiscible fluids, according to an embodiment of the present description.

In an embodiment of the present description, as shown in FIG. 10, a containment fluid layer 430 may be disposed over the dielectric low-boiling point liquid 120, wherein the containment fluid layer 430 is lighter than (e.g., lower density) and substantially immiscible with the dielectric low-boiling point liquid 120, such that the containment fluid layer 430 floats gravitationally above the dielectric low-boiling point liquid 120 and forms an interface 432 therebetween. In operation, the tubes 412 of the condensation structure 410 may extend through the containment fluid layer 430. Thus, in operation, the condensation structure 410 will cool the containment fluid layer 430, which, in turn, will condense the vapor state bubbles 122 back to the dielectric low-boiling point liquid 120. In a specific embodiment of the present description, the dielectric low-boiling point liquid 120 may comprise a fluorocarbon-based fluid and the containment fluid layer 430 may comprise deionized water. As will be understood to those skilled in the art, as the vapor state of the dielectric low-boiling point liquid 120 is contained by the containment fluid layer 430, the vapor loss 128 (see FIG. 9) will be greatly reduced, if not substantially illuminated.

Figure 11:
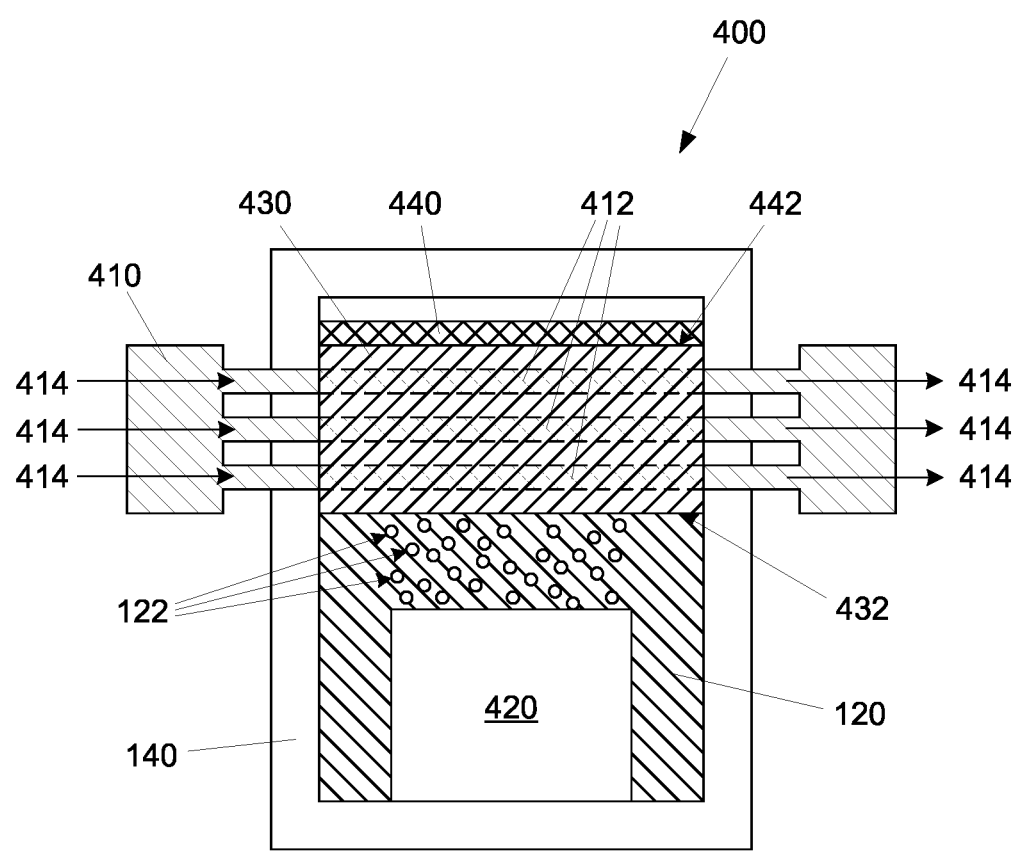
FIG. 11 is a side cross-sectional view of an immersion cooling assembly having three immiscible fluids, according to an embodiment of the present description.

In a further embodiment of the present description shown in FIG. 11, a second defense against vapor loss may comprise disposing a capping fluid layer 440 on the containment fluid layer 430, wherein the capping fluid layer 440 is lighter than (e.g., lower density) and substantially immiscible with the containment fluid liquid 430, such that the capping fluid layer 440 floats gravitationally above the dielectric containment fluid liquid 430 and forms an interface 442 therebetween. In a specific embodiment of the present description, the capping fluid layer 440 may comprise a silicone oil.

Figure 12:
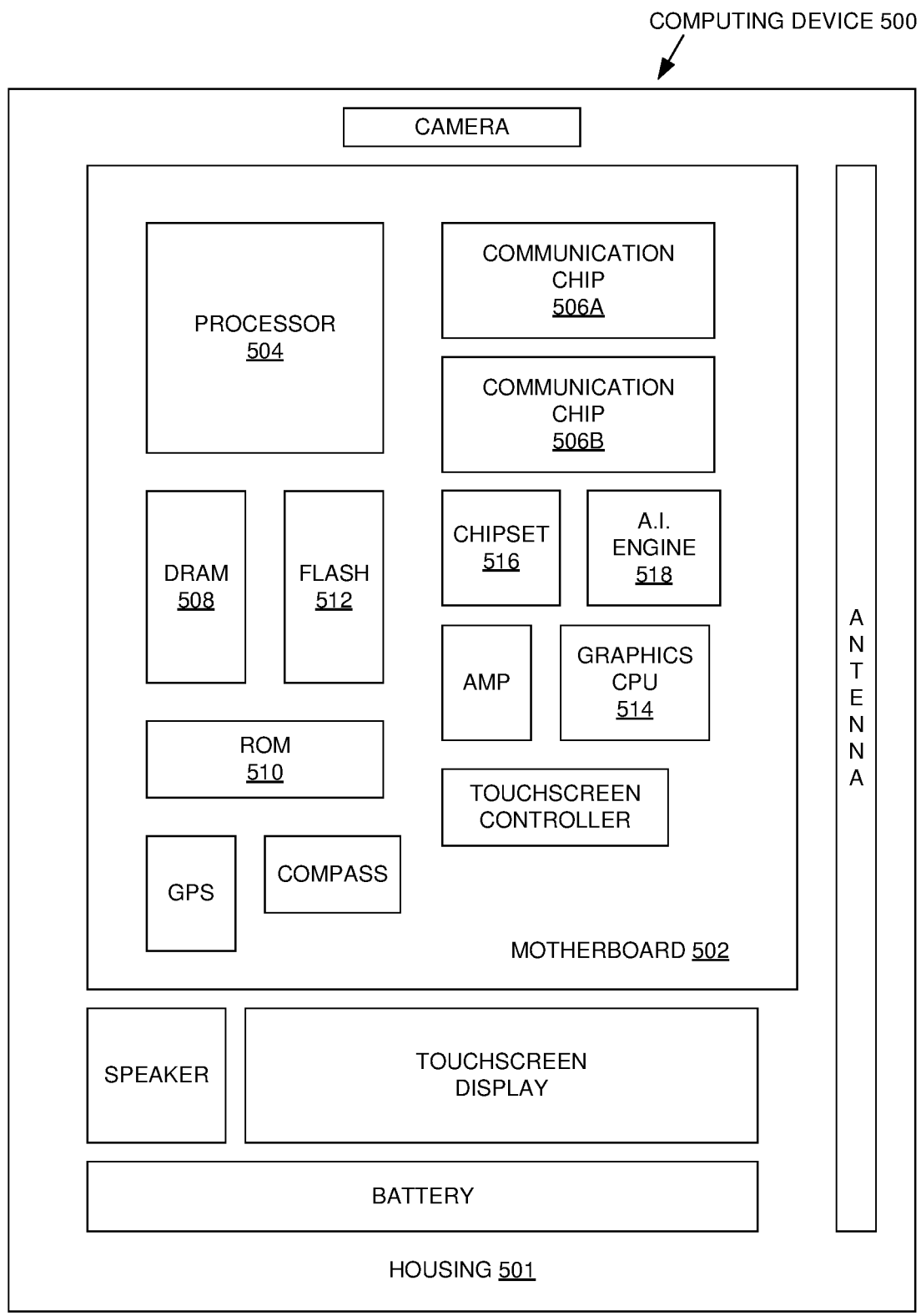
FIG. 12 is an electronic system, according to one embodiment of the present description.

FIG. 12 illustrates an electronic or computing device/system 500 in accordance with one implementation of the present description. The computing device 500 may include a housing 501 having a board 502 disposed therein. The computing device 500 may include a number of integrated circuit components, including but not limited to a processor 504, at least one communication chip 506A, 506B (including Network Devices or Processors), volatile memory 508 (e.g., DRAM), non-volatile memory 510 (e.g., ROM), flash memory 512, a graphics processor or CPU 514, a digital signal processor (not shown), a crypto processor (not shown), a chipset 516, an Artificial Intelligence (A.I.) Engine 518, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

The entire computing device 500 or at least one of the integrated circuit components within the computing device 500 may be immersed in a two-phase immersion system. In one embodiment, the integrated circuit component may comprise an integrated circuit package having a heat dissipation device thermally coupled to integrated circuit device, wherein the heat dissipation device includes a boiling enhancement structure formed on or directly attached thereto. In another embodiment of the present description, the heat dissipation device may be removed and the boiling enhancement structure may be formed on or directly attached on the integrated circuit device. In a further embodiment of the present description, the integrated circuit assembly may include at least one support device that is electrically attached to an electronic board to which the integrated circuit device is electrically attached, wherein a boiling enhancement material layer is conformally formed to over the support device and at least a portion of the electronic board. In still a further embodiment of the present description, the two-phase immersion cooling system may include a low boiling point liquid including at least two liquids that are substantially immiscible with one another.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-12. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an apparatus, comprising an integrated circuit device having a first surface and an opposing second surface, a heat dissipation device having a first surface and an opposing second surface, wherein the first surface of the heat dissipation device is thermally attached to the second surface of the integrated circuit device, and a boiling enhancement structure directly attached to the second surface of the heat dissipation device.

In Example 2, the subject matter of Example 1 can optionally include the boiling enhancement structure being adhered to the second surface of the heat dissipation device.

In Example 3, the subject matter of Example 2 can optionally include the boiling enhancement structure comprising a carbon foam.

In Example 4, the subject matter of Example 2 can optionally include the boiling enhancement structure comprising a metal foam.

In Example 5, the subject matter of Example 4 can optionally include the metal foam comprising copper.

In Example 6, the subject matter of Example 4 can optionally include the metal foam comprising nickel.

In Example 7, the subject matter of Example 2 can optionally include the boiling enhancement structure comprising a metal mesh.

In Example 8, the subject matter of Example 7 can optionally include the metal foam comprising copper.

In Example 9, the subject matter of Example 2 can optionally include the boiling enhancement structure comprising a thermally conductive film having a sintered metal powder layer.

In Example 10, the subject matter of Example 9 can optionally include the thermally conductive film comprising copper.

In Example 11, the subject matter of Example 9 can optionally include the sintered metal powder layer comprising copper.

In Example 12, the subject matter of Example 2 can optionally include a thermally conductive adhesive disposed between the boiling enhancement structure and the second surface of the heat dissipation device.

In Example 13, the subject matter of Example 12 can optionally include the thermally conductive adhesive comprising a solder material.

In Example 14, the subject matter of Example 12 can optionally include the thermally conductive adhesive comprising a thermally conductive polymer.

In Example 15, the subject matter of Example 12 can optionally include the thermally conductive adhesive comprising a metal filled epoxy.

In Example 16, the subject matter of Example 1 can optionally include the boiling enhancement structure being formed on the second surface of the heat dissipation device.

In Example 17, the subject matter of Example 16 can optionally include the boiling enhancement structure comprising a metal powder sintered to the second surface of the heat dissipation device.

In Example 18, the subject matter of any of Examples 1 to 17 can optionally include a dielectric low-boiling point liquid contacting the boiling enhancement structure.

Example 19 is an apparatus, comprising an integrated circuit device having a first surface and an opposing second surface, and a boiling enhancement structure directly attached to the second surface of the integrated circuit device.

In Example 20, the subject matter of Example 19 can optionally include the boiling enhancement structure being adhered to the second surface of the integrated circuit device.

In Example 21, the subject matter of Example 20 can optionally include the boiling enhancement structure comprising a carbon foam.

In Example 22, the subject matter of Example 20 can optionally include the boiling enhancement structure comprising a metal foam.

In Example 23, the subject matter of Example 22 can optionally include the metal foam comprising copper.

In Example 24, the subject matter of Example 22 can optionally include the metal foam comprising nickel.

In Example 25, the subject matter of Example 20 can optionally include the boiling enhancement structure comprising a metal mesh.

In Example 26, the subject matter of Example 25 can optionally include the metal foam comprising copper.

In Example 27, the subject matter of Example 20 can optionally include the boiling enhancement structure comprising a thermally conductive film having a sintered metal powder layer.

In Example 28, the subject matter of Example 27 can optionally include the thermally conductive film comprising copper.

In Example 29, the subject matter of Example 27 can optionally include the sintered metal powder layer comprising copper.

In Example 30, the subject matter of Example 20 can optionally include a thermally conductive adhesive disposed between the boiling enhancement structure and the second surface of the heat dissipation device.

In Example 31, the subject matter of Example 30 can optionally include the thermally conductive adhesive comprising a solder material.

In Example 32, the subject matter of Example 30 can optionally include the thermally conductive adhesive comprising a thermally conductive polymer.

In Example 33, the subject matter of Example 30 can optionally include the thermally conductive adhesive comprising a metal filled epoxy.

In Example 34, the subject matter of Example 19 can optionally include the boiling enhancement structure being formed on the second surface of the heat dissipation device.

In Example 35, the subject matter of Example 34 can optionally include the boiling enhancement structure comprising a metal powder sintered to the second surface of the heat dissipation device.

In Example 36, the subject matter of any of Examples 19 to 36 can optionally include a dielectric low-boiling point liquid contacting the boiling enhancement structure.

Example 37 is an apparatus comprising an integrated circuit device electrically attached to a first surface of an electronic substrate; a support device electrically attached to the first surface of the electronic substrate, wherein the support device is electrically attached to the integrated circuit device; and a conformal boiling enhancement coating covering the support device and a portion of the first surface of the electronic substrate.

In Example 38, the subject matter of Example 37 can optionally include the support device comprising a voltage regulator.

In Example 39, the subject matter of Example 37 can optionally include the support device comprising a capacitor.

In Example 40, the subject matter of any of Examples 37 to 39 can optionally include the conformal boiling enhancement coating comprising a micro-porous coating.

In Example 41, the subject matter of Example 40 can optionally include the micro-porous coating comprising conductive particles dispersed in an epoxy material.

In Example 42, the subject matter of Example 41 can optionally include the conductive particles comprising diamond particles.

In Example 43, the subject matter of Example 41 can optionally include the conductive particles comprising alumina particles.

In Example 44, the subject matter of any of Examples 37 to 43 can optionally include a dielectric low-boiling point liquid contacting the boiling enhancement structure.

Example 45 is an apparatus comprising a fluid containment structure; a dielectric low-boiling point liquid within the fluid containment structure; a containment fluid layer on the dielectric low-boiling point liquid, wherein the containment fluid layer is lighter than and substantially immiscible with the dielectric low-boiling point liquid; and a condensation structure extending though the containment structure.

In Example 46, the subject matter of Example 45 can optionally include a heat generation source disposed within the dielectric low-boiling point liquid.

In Example 47, the subject matter of Example 46 can optionally include the heat generation source comprising an integrated circuit device.

In Example 48, the subject matter of any of Examples 45 to 47 can optionally include the dielectric low-boiling point liquid comprising a fluorocarbon-based fluid.

In Example 49, the subject matter of Example 48 can optionally include the fluorocarbon-based fluid comprising perfluorohexane.

In Example 50, the subject matter of Example 48 can optionally include the fluorocarbon-based fluid comprising perfluoroalkylmorpholine.

In Example 51, the subject matter of any of Examples 45 to 50 can optionally include the containment fluid comprising water.

In Example 52, the subject matter of any of Examples 45 to 51 can optionally include a capping liquid layer on the containment fluid layer, wherein the capping fluid layer is lighter than and substantially immiscible with the containment fluid liquid.

In Example 53, the subject matter of Example 52 can optionally include the capping liquid layer comprising silicone oil.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
   an integrated circuit device electrically attached to a first surface of an electronic substrate;
   a support device electrically attached to the first surface of the electronic substrate, wherein the support device is electrically attached to the integrated circuit device; and
   a conformal boiling enhancement coating covering the support device and a portion of the first surface of the electronic substrate, the boiling enhancement coating to be in direct contact with a liquid in which both the integrated circuit device and the support device are to be immersed.

2. The apparatus of claim 1, wherein the support device comprises a voltage regulator.

3. The apparatus of claim 1, wherein the conformal boiling enhancement coating comprises a micro-porous coating.

4. The apparatus of claim 3, wherein the micro-porous coating comprises conductive particles dispersed in an epoxy material.

5. The apparatus of claim 4, wherein the conductive particles comprise one of diamond particles and alumina particles.

6. An apparatus, comprising:
   a fluid containment structure;
   a package substrate within the fluid containment structure;
   an integrated circuit device coupled to the package substrate, the integrated circuit device having a first surface and an opposing second surface; and
   a boiling enhancement structure directly attached to the second surface of the integrated circuit device;
   a dielectric low-boiling point liquid within the fluid containment structure and in direct contact with the boiling enhancement structure;
   a containment fluid layer on the dielectric low-boiling point liquid, wherein the containment fluid layer is lighter than and substantially immiscible with the dielectric low-boiling point liquid;
   a capping fluid layer on the containment fluid layer, wherein the capping fluid layer comprises silicone oil and is lighter than, and substantially immiscible with, the containment fluid layer; and
   a condensation structure extending though the containment structure.

7. The apparatus of claim 6, wherein the boiling enhancement structure is adhered to the second surface of the integrated circuit device with a thermally conductive adhesive.

8. The apparatus of claim 7, wherein the boiling enhancement structure comprises one of a carbon foam, a metal foam, a metal mesh, and a sintered metal powder layer.

9. The apparatus of claim 7, wherein the thermally conductive adhesive is a solder material.

10. The apparatus of claim 6, wherein the boiling enhancement structure comprises metal particles sintered to the second surface of the integrated circuit device.

11. The apparatus of claim 6, further comprising a heat generation source disposed within the dielectric low-boiling point liquid.

12. The apparatus of claim 6, wherein the dielectric low-boiling point liquid comprises a fluorocarbon-based fluid.

13. The apparatus of claim 6, wherein the containment fluid layer comprises water.

14. The apparatus of claim 6, wherein the boiling enhancement structure comprises a carbon foam or a metal foam.

15. The apparatus of claim 14, wherein the metal foam comprises copper or nickel.

* * * * *